United States Patent
Tate (10) Patent No.: US 10,980,135 B2
(45) Date of Patent: Apr. 13, 2021

(54) INSULATED SOCKET BODY AND TERMINALS FOR A LAND GRID ARRAY SOCKET ASSEMBLY

(71) Applicant: John O. Tate, Lincoln, RI (US)

(72) Inventor: John O. Tate, Lincoln, RI (US)

( * ) Notice: Subject to any disclaimer, the term of this patent is extended or adjusted under 35 U.S.C. 154(b) by 0 days.

(21) Appl. No.: 16/991,073

(22) Filed: Aug. 12, 2020

(65) Prior Publication Data

US 2020/0375037 A1 Nov. 26, 2020

Related U.S. Application Data

(63) Continuation-in-part of application No. 16/791,952, filed on Feb. 14, 2020.

(60) Provisional application No. 62/807,085, filed on Feb. 18, 2019.

(51) Int. Cl.
*H05K 3/34* (2006.01)
*H01R 13/187* (2006.01)
*H01R 13/24* (2006.01)

(52) U.S. Cl.
CPC ......... *H05K 3/3436* (2013.01); *H01R 13/187* (2013.01); *H01R 13/2428* (2013.01); *H05K 2201/10265* (2013.01); *H05K 2201/10325* (2013.01); *H05K 2201/10719* (2013.01)

(58) Field of Classification Search
CPC . H05K 3/3436; H05K 13/187; H01R 13/2428
USPC ....................................................... 439/729
See application file for complete search history.

(56) References Cited

U.S. PATENT DOCUMENTS

| 4,505,529 | A | * | 3/1985 | Barkus | H01R 12/714 439/82 |
| 4,528,500 | A | * | 7/1985 | Lightbody | H01R 13/2421 324/537 |
| RE34,084 | E | * | 9/1992 | Noschese | H01R 12/714 439/245 |
| 5,167,512 | A | | 12/1992 | Walkup | |
| 5,380,210 | A | * | 1/1995 | Grabbe | H01R 13/2435 439/66 |
| 5,388,998 | A | * | 2/1995 | Grange | G01R 1/067 347/50 |
| 5,641,315 | A | * | 6/1997 | Swart | G01R 1/06722 324/72.5 |

(Continued)

*Primary Examiner* — Alexander Gilman
(74) *Attorney, Agent, or Firm* — Barlow, Josephs & Holmes, Ltd.

(57) ABSTRACT

An insulated socket body and terminal assembly for an integrated chip includes upper and lower insulated socket body portions which are received together in mated relation to define a socket body having a plurality of lumens extending therethrough. The assembly further includes a like plurality of monolithic spring terminals received within the lumens, wherein the spring terminals include upper and lower contact ends connected by a central cantilever spring. The central cantilever springs are received within central recess portions of the lumens and the upper and lower contact ends are received in respective upper and lower guide portions of the lumens and project outwardly from respective upper and lower surfaces of the upper and lower insulated socket body portions. The central recess portions of the lumens are configured to retain the cantilever springs in a first uncompressed configuration and in a second compressed configuration.

20 Claims, 8 Drawing Sheets

(56) References Cited

U.S. PATENT DOCUMENTS

| | | | | |
|---|---|---|---|---|
| 5,990,697 A * | 11/1999 | Kazama | | G01R 1/067 324/72.5 |
| 6,043,666 A * | 3/2000 | Kazama | | G01R 1/06722 324/755.05 |
| 6,257,899 B1 * | 7/2001 | Walkup | | H01R 12/52 439/66 |
| 6,512,389 B1 * | 1/2003 | Kocher | | G01R 1/07371 324/750.26 |
| 6,786,738 B2 * | 9/2004 | Lin | | H01R 13/2435 439/71 |
| 6,955,572 B1 * | 10/2005 | Howell | | H01R 13/2442 439/862 |
| 6,994,565 B2 * | 2/2006 | Harper, Jr. | | H01R 12/52 439/66 |
| 7,331,797 B1 * | 2/2008 | Ju | | H01R 13/2435 439/66 |
| 7,448,877 B1 * | 11/2008 | Pennypacker | | H01R 13/2435 439/66 |
| 7,458,818 B2 * | 12/2008 | Kiyofuji | | G01R 1/07371 324/750.07 |
| 7,517,225 B2 * | 4/2009 | Cherian | | G01R 1/0466 439/66 |
| 7,568,917 B1 * | 8/2009 | Malstrom | | H01R 13/2435 439/66 |
| 7,825,676 B2 * | 11/2010 | Koizumi | | H05K 3/308 324/750.16 |
| 8,147,253 B2 | 4/2012 | Goodman et al. | | |
| 8,147,256 B2 * | 4/2012 | Jin | | H01R 12/714 439/83 |
| 8,373,430 B1 | 2/2013 | Sochor | | |
| 8,535,093 B1 * | 9/2013 | Mason | | H01R 13/6585 439/607.05 |
| 8,613,622 B2 * | 12/2013 | Garcia | | H01R 13/2421 439/66 |
| 8,672,688 B2 * | 3/2014 | Florence, Jr. | | H01R 12/52 439/66 |
| 8,708,716 B1 * | 4/2014 | Ho | | H01R 43/02 439/83 |
| 8,974,236 B2 * | 3/2015 | Terhune, IV | | H01R 13/2442 439/78 |
| 9,039,448 B2 * | 5/2015 | Mason | | H01R 13/658 439/607.09 |
| 9,252,513 B2 * | 2/2016 | Masuda | | H01R 12/714 |
| 9,437,948 B2 * | 9/2016 | Ju | | H01R 12/7076 |
| 10,547,136 B2 * | 1/2020 | Ho | | H01R 12/55 |
| 10,605,830 B2 * | 3/2020 | Hsieh | | G01R 1/07342 |
| 2005/0208786 A1 | 9/2005 | Dittmann | | H01R 13/2407 439/66 |
| 2008/0227307 A1 * | 9/2008 | Alden | | H01R 12/714 439/66 |
| 2009/0253287 A1 * | 10/2009 | Polnyi | | H01R 13/2457 439/331 |
| 2009/0269950 A1 * | 10/2009 | Liao | | H01R 13/2492 439/66 |
| 2014/0017957 A1 * | 1/2014 | Horchler | | H01R 12/716 439/680 |

\* cited by examiner

INSULATED SOCKET BODY AND TERMINALS FOR A LAND GRID ARRAY SOCKET ASSEMBLY

CROSS REFERENCE TO RELATED APPLICATIONS

This application is a continuation-in-part of, and claims benefit to, U.S. application Ser. No. 16/791,952 filed Feb. 14, 2020, entitled "IMPROVED INSULATED SOCKET BODY AND TERMINALS FOR A LAND GRID ARRAY SOCKET ASSEMBLY," which is related to and claims benefit of U.S. Provisional Application No. 62/807,085 filed Feb. 18, 2019, entitled "IMPROVED INSULATED SOCKET BODY AND TERMINALS FOR A LAND GRID ARRAY SOCKET ASSEMBLY," the entire contents of which are incorporated herein by reference.

BACKGROUND OF THE DISCLOSURE

The present disclosure relates generally to electronic device connectors or sockets and more particularly to land grid array (LGA) sockets for connecting land grid array (LGA) chips to printed circuit boards (PCBs).

Figure 1:
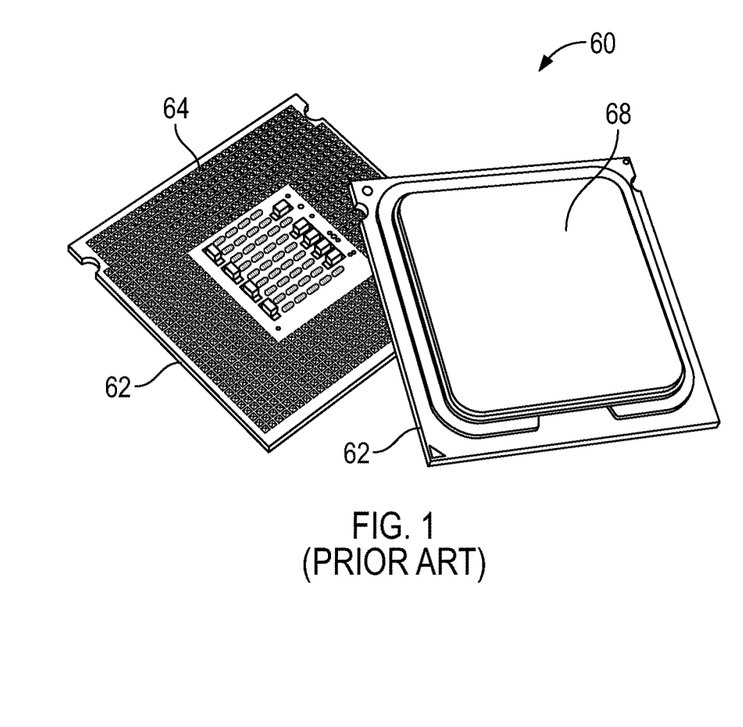
FIG. 1 illustrates top and bottom views of a prior art land grid array (LGA) chip package.
Figure 2:
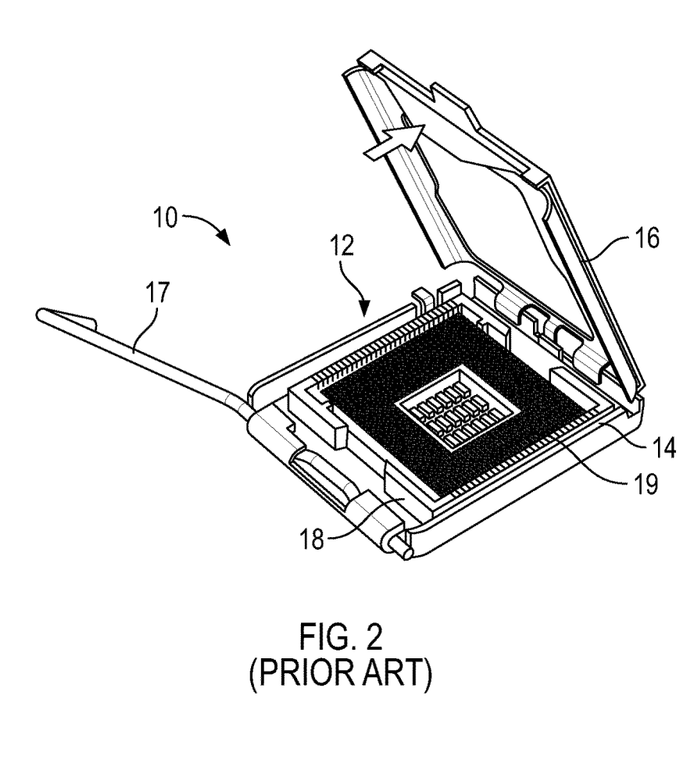
FIGS. 2 and 3 illustrate a prior art LGA socket assembly.
Figure 3:
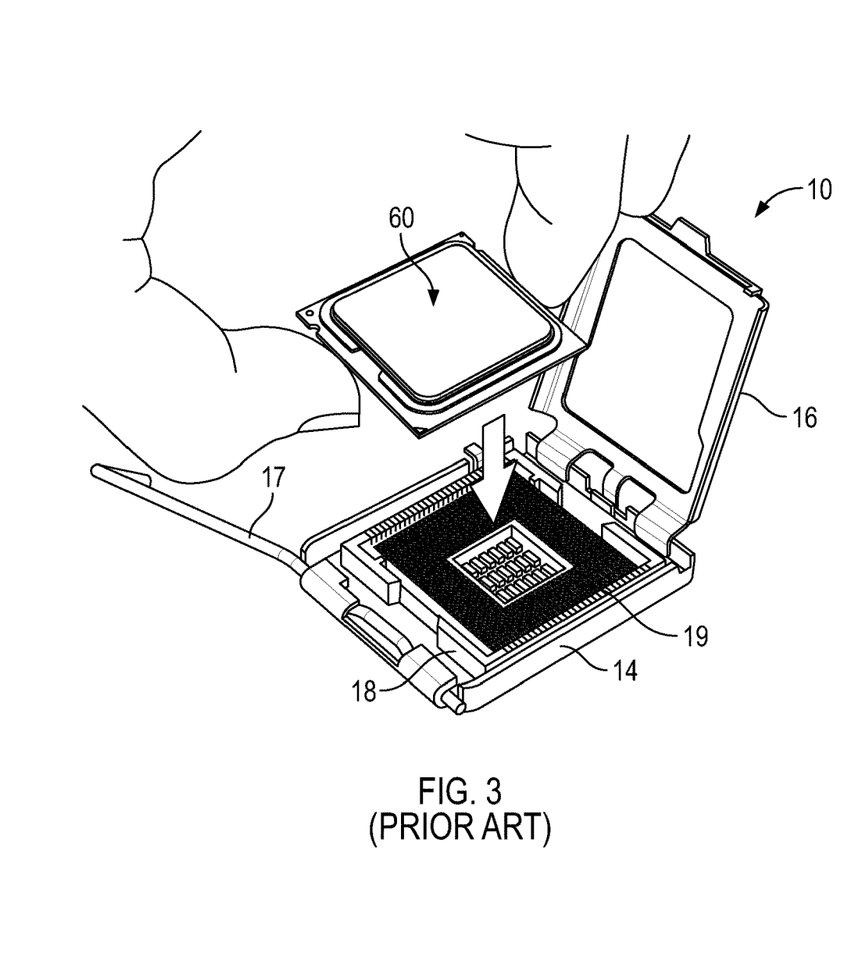
Figure 4:
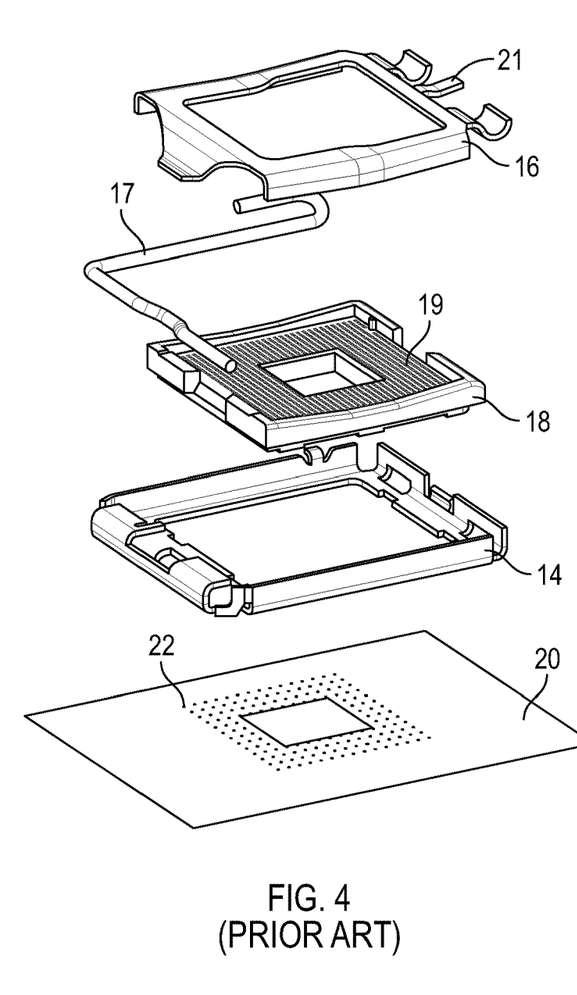
FIG. 4 illustrates an exploded view of the prior art LGA socket assembly with a PCB and corresponding contact array.
Figure 5:
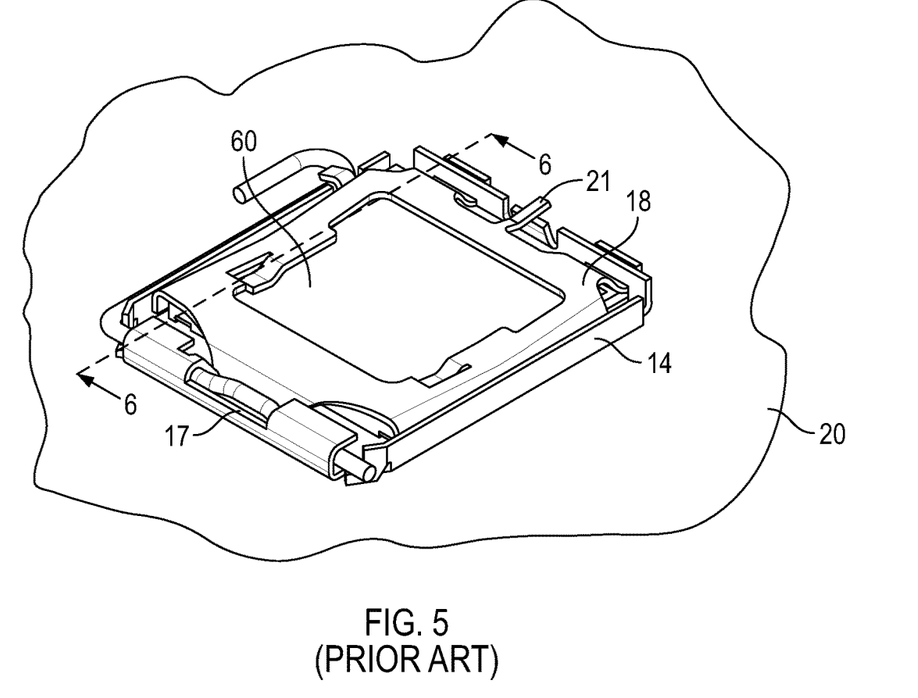
FIG. 5 illustrates a perspective view of the socket assembly of FIG. 4.
Figure 6:
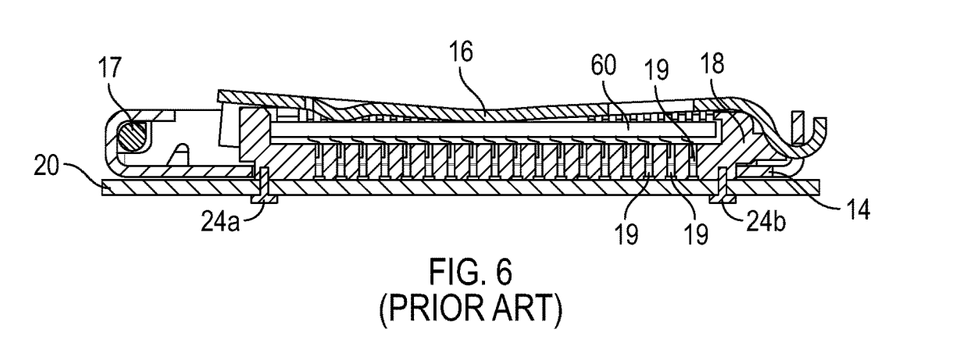
FIG. 6 illustrates a cross-sectional view thereof taken along line 6-6 of FIG. 5.
Figure 7:
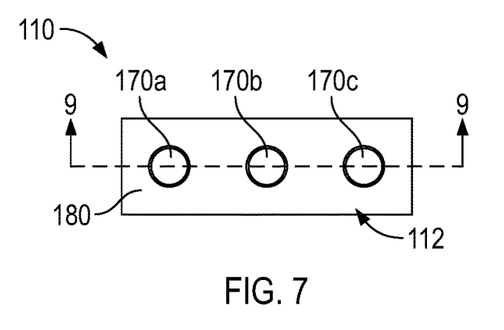
FIG. 7 is a top view of an improved insulated socket body and spring terminal in accordance with a first exemplary embodiment.
Figure 8:
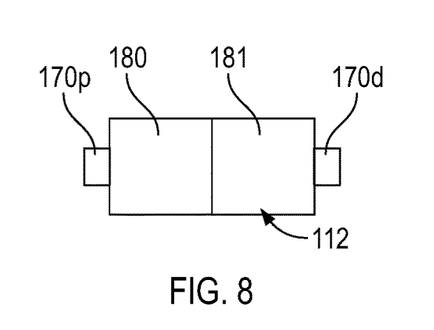
FIG. 8 is side view of the improved socket body and spring terminal of FIG. 7.

LGA connector assemblies or sockets are widely used in the connector industry for electrically connecting LGA chips to PCBs, particularly in personal computers. Referring to FIG. 1, many of the current PC processors are manufactured in an LGA chip package 60 which includes a circuit substrate 62 having a plurality of gold contact pads 64 arranged in an array. The chip (not shown) is mounted on the upper surface of the substrate 62 and enclosed in an integrated heat sink closure or cap 68.

Referring to FIGS. 2-6, a typical prior art LGA socket assembly or fixture 10 is illustrated. The LGA socket connector assembly 10, in general, comprises a hinged frame generally indicated at 12 having a lower mounting portion 14 and an upper load plate 16. Within the frame 12, for example in the lower mounting portion 14, is an insulated socket body 18 containing a plurality of electrical terminals 19 which extend through the socket body 18. The socket assembly 10 is mounted onto a PCB 20 (see FIGS. 4 and 6) where the lower contact end of the terminals 19 engages a plurality of gold contact pads 22 arranged in an array on the PCB 20. The socket assembly 10 is retained in position on the PCB 20 with screws 24a, 24b extending through the PCB 20 and into the insulated socket body 18 (FIG. 6), or by other known means. Turning back to FIG. 3, the load plate 16 is hinged open to receive the LGA chip 60 which is seated into the insulated socket body 18. The LGA contact pads 64 on the lower surface of the LGA chip 60 engage the upper contact ends of the terminals 19 exposed on the upper surface of the socket body 18. The load plate 16 is hinged closed and retained with a locking bar 17 (FIG. 5) to maintain good electrical contact pressure between the LGA chip 60 and the terminals 19 of the socket body 18. In some embodiments, a spring tab 21 can be located on the load plate to increase the pressure between the LGA chip 60 and the terminals 19.

While fully functional for their intended purpose, the prior art terminals 19 have delicate contact ends which can be easily damaged by incorrect assembly or misalignment of the socket assembly 10 with the PCB 20 or incorrect insertion of the LGA chip 60 into the socket body 18. Thus, there is a perceived need in the industry for a more robust socket body and terminal design in which the terminals are not as easily damaged.

SUMMARY OF THE INVENTION

An object of the invention is an improved socket body and terminal configuration for use in both LGA production sockets, LGA test sockets, and other electronic component sockets. The assembly includes an insulated socket body comprising upper and lower insulated socket body portions which are received together in mated relation to define a socket body having a plurality of lumens extending therethrough. The assembly further includes a like plurality of monolithic spring terminals received within the lumens, wherein the spring terminals include upper and lower contact ends connected by a central cantilever spring. The central cantilever springs are received within central recess portions of the lumens and the upper and lower contact ends are received in respective upper and lower guide portions of the lumens and project outwardly from respective upper and lower surfaces of the upper and lower insulated socket body portions. The improved spring terminals provide biased spring compression in both directions of contact and further provides independent movement of the upper and lower contact ends within the socket body. In some embodiments, the instant spring terminal contacts can advantageously be unitary, monolithic, or made of a single piece of material. Alternatively, the instant spring terminals can be manufactured from a plurality of pieces of material in some embodiments. Further, in some embodiments, the spring terminals contact can be formed from a wire and can have a generally circular, triangular, square, rectangular, or other cross-sectional shapes.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE PREFERRED EMBODIMENTS

Certain exemplary embodiments will now be described to provide an overall understanding of the principles of the structure, function, manufacture, and use of the device and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present disclosure. Further, in the present disclosure, like-numbered components of the embodiments may have similar features, and thus within a particular embodiment each feature of each like-numbered component is not necessarily fully elaborated upon. Additionally, to the extent that linear or circular dimensions are used in the description of the disclosed systems, devices, and methods, such dimensions are not intended to limit the types of shapes that can be used in conjunction with such systems, devices, and methods. A person skilled in the art will recognize that an equivalent to such linear and circular dimensions can easily be determined for any geometric shape. Further, to the extent that directional terms like proximal, distal, top, bottom, up, or down are used, they are not intended to limit the systems, devices, and methods disclosed herein. A person skilled in the art will recognize that these terms are merely relative to the system and device being discussed and are not universal.

Figure 22:
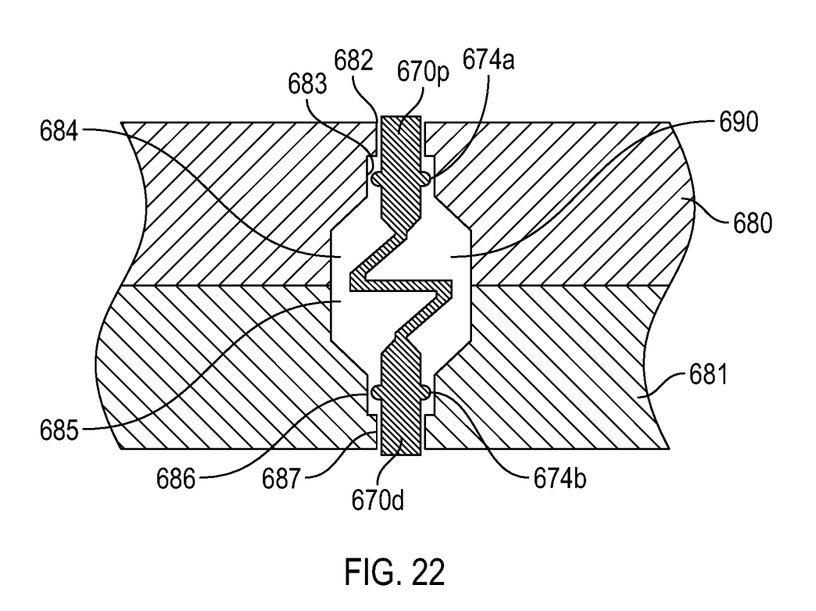
FIG. 22 is a cross sectional view of an exemplary socket body and terminal with stop lugs according to another exemplary embodiment.

Referring now to the assembly shown in FIGS. 7-17, the present disclosure provides an improved insulated socket body and spring terminal assembly 110 comprised of an insulated socket body generally indicated 112 and a plurality of individual spring terminals 170. For the sake of simplicity, FIGS. 7-17 illustrate only the improved insulated socket body 112 and spring terminals 170 without the outer fixture and frame elements. However, it should be fully appreciated by one skilled in the art that the described socket body 112 and spring terminals 170 are configured to be received within the same or similar fixture 10 as described hereinabove. While only three terminals are shown, one of ordinary skill in the art would understand that these lumens and spring terminals would extend in an array as needed for the particular electrical device fixture. In general, the socket and terminal assembly 110 can be substantially similar to the socket assembly 10 shown in the prior art FIG. 6, for example. However, and importantly, the instant assembly 110 provides for an improved, reusable, and reliable electrical connection between the LGA chip 160 and the PCB 120. In some embodiments, the socket body 112 can be formed from an electrically insulating material, such as PVC, glass, asbestos, rigid laminate, varnish, resin, Teflon, rubber, etc. In the illustrated embodiment, as seen in FIGS. 8-10 and 17, the socket body 112 can be formed from two mating parts, namely an upper socket body portion 180 and a lower socket body portion 181, which are the same or similar. The socket body 112 can receive one or a plurality of spring terminals or contact members 170a-c, disposed in an array, within corresponding lumens 190 that extend through the upper and lower socket body portions 180, 181 of the socket body 112. In some embodiments, the lumens 190 can generally have at least two different diameters, or cross-sectional dimensions. In some alternatives, the lumen can have at least three different diameters, as shown in FIG. 22.

Figure 9:
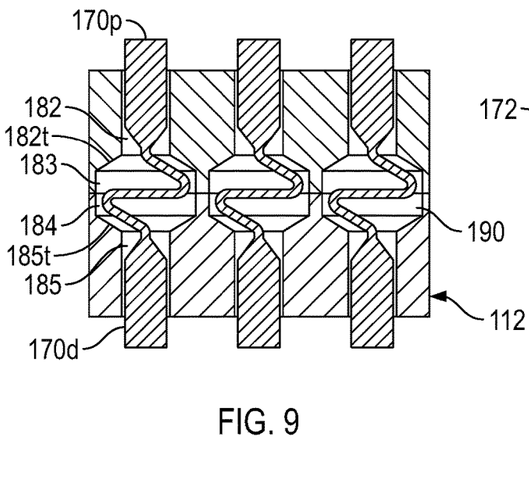
FIG. 9 is a cross sectional view of the improved socket body and spring terminal of FIG. 7 along line 9-9 of FIG. 7.
Figure 10:
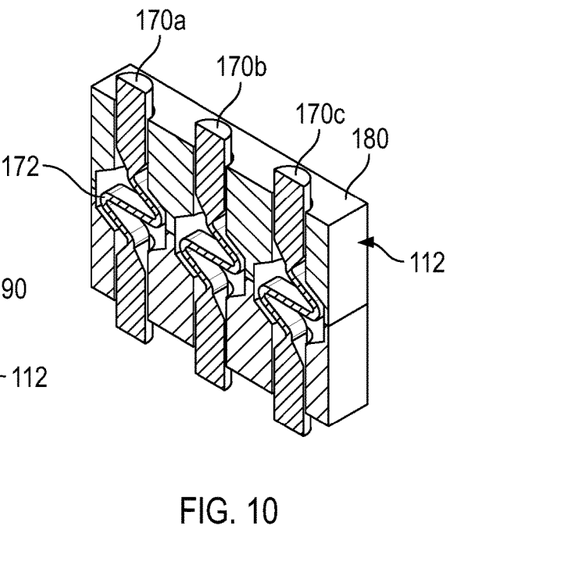
FIG. 10 is a perspective cross sectional view of the improved socket body and spring terminal of FIG. 7 along line 9-9 of FIG. 7.
Figures 11, 12:
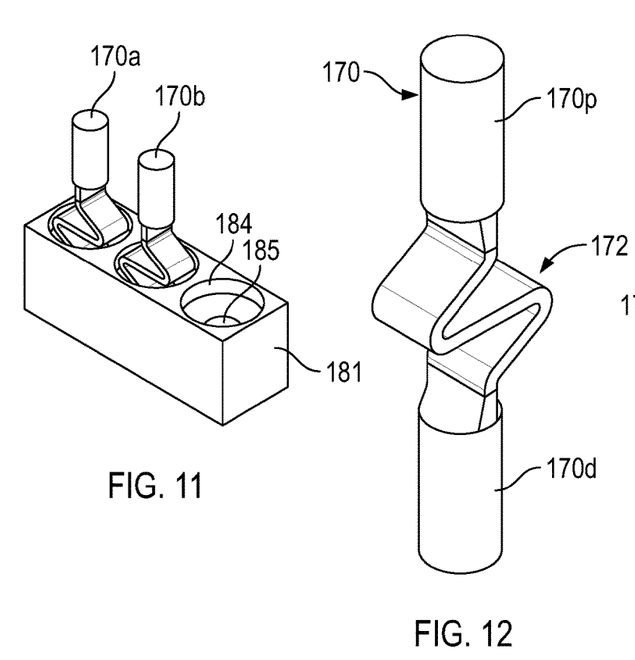
FIG. 11 is a partial perspective view of a bottom socket body and two spring terminals disposed therein.
FIGS. 12-16 are various views of the improved spring terminal of FIG. 7.
Figure 13:
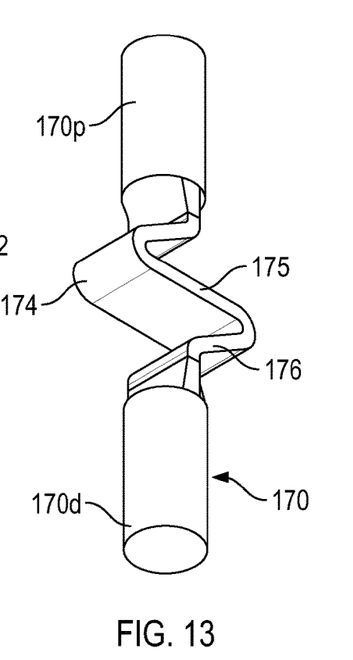
Figure 14:
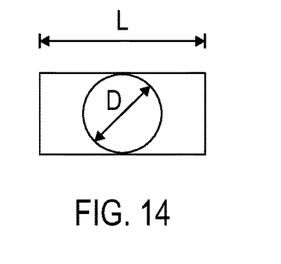
Figure 23:
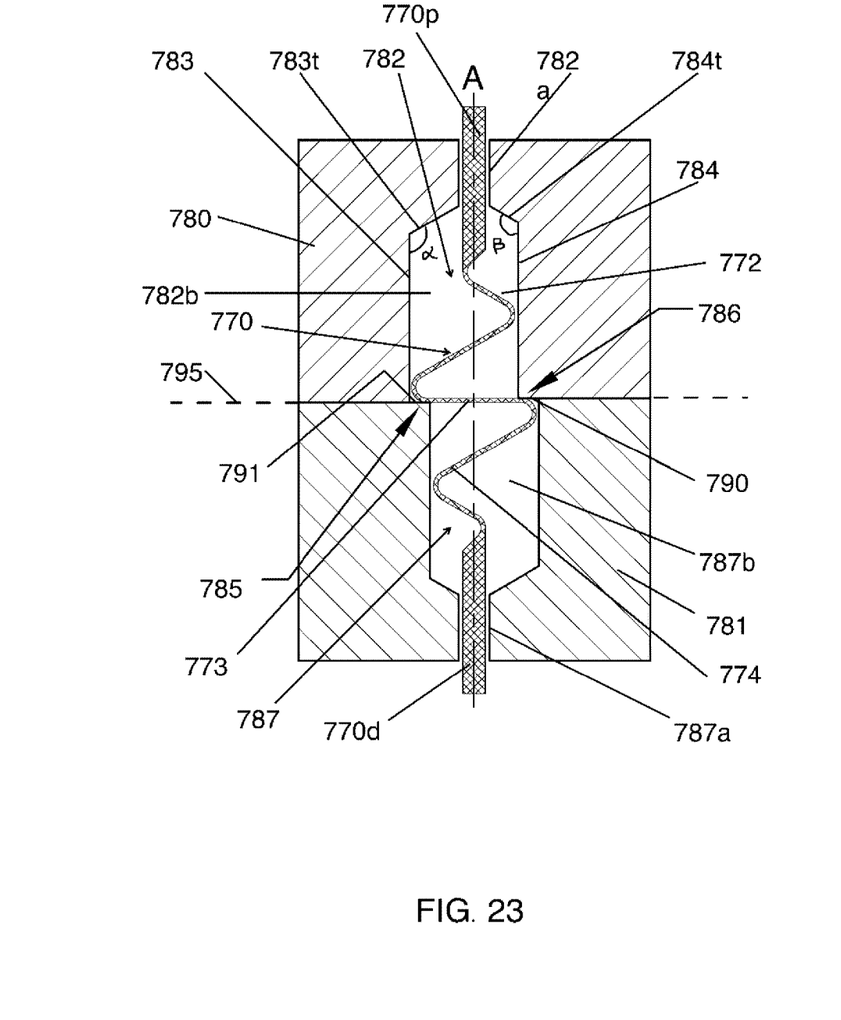
FIG. 23 is a cross sectional view of an exemplary socket body and terminal according to yet another exemplary embodiment.
Figure 24:
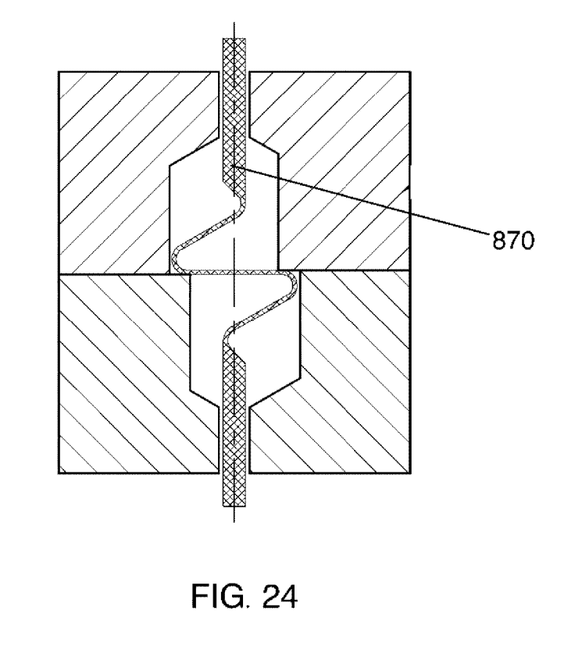
FIG. 24 is a cross sectional view of an alternative exemplary socket body and terminal.

For example, as shown in FIGS. 9-11, the lumens 190 can have a first upper guide opening section 182 in the upper body portion having a first diameter, a second spring recess section 183 having at least a second larger diameter. The transition region 182t from the first upper guide section 182 to the second spring recess section 183 can be gradual, as shown, or can be defined by a perpendicular shoulder portion such that there is no gradual increase of the interior diameter, or in a further alternative, a rounded shoulder can provide for a gradual increase/decrease of diameter. A coaxially aligned portion of the lumen 190 can be disposed in the lower body portion 181 and can substantially mirror the first and second sections 182, 183 of the upper body portion 180. As illustrated, a third upper spring recess section 184 can define a second half of the spring recess and have a diameter that is the same as the second diameter. Again, similar to the second section, the third section can have a transition section 185t that defines a gradual reduction in diameter to the fourth lower portion 185. Extending downward from the third upper section 184, the fourth lower section 185 can define a second, lower, guide opening. The fourth lower section 185 can have an interior diameter that is substantially equal to the first diameter of the first upper section 182 in the upper body portion 180. The lumen 190 can be symmetrical about the contact plane between the upper and lower body portion 180, 181 or can be asymmetrical as shown in FIGS. 23 and 24. The upper and lower socket body portions 180, 181 can include a plurality of contact guide openings and spring recesses that, when mated together, form a plurality of axial guide passages and spring recesses for the respective terminals 170 received therein. The upper and lower socket body portions 180, 181 can be fixed together by known methods. The respective springs 170a-c disposed within the plurality of lumens 190 can be specially designed, as discussed below, to ensure proper contact between the LGA chip 160 and the PCB 120. Moreover, the respective springs 170a-c can be designed to be constrained within the socket body 110, no matter the orientation of the socket body itself, thereby reducing the possibility of the springs 170a-c being lost during transport, installation, or other handlings.

Figure 15:
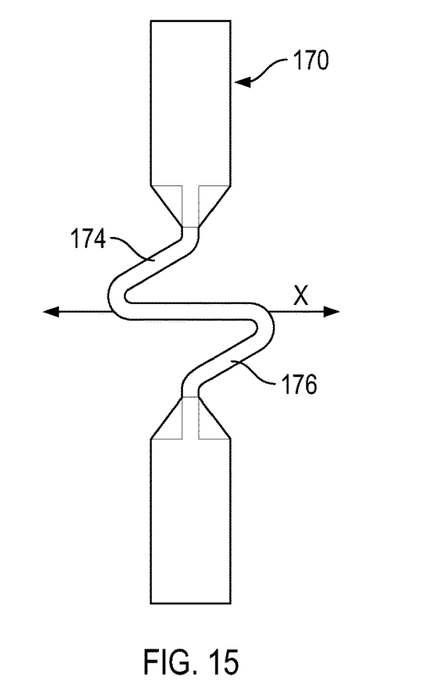
Figure 16:
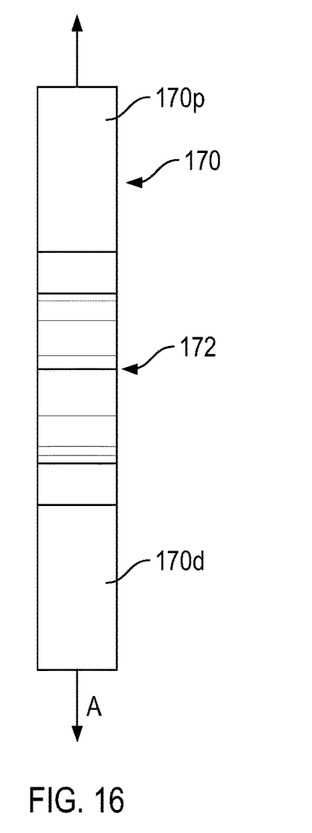

Referring to FIGS. 12-16, the spring terminals 170a-c themselves can comprise a one-piece, monolithic, or unitary, structure that is stamped, forged, molded, rolled, or otherwise formed. The spring terminals 170 can be formed from any conductive metal which maintains an elastic spring bias in compression and can be formed from any cross-sectional shape such as round, rectangular, or square or a combination of stamped or formed shapes as illustrated. For the sake of simplicity, only a single spring terminal 170a will be discussed in detail, but it should be understood that all of the terminals 170 in this embodiment are substantially the same. In one embodiment, the upper and lower contact ends 170p, 170d can have a diameter D, or cross-sectional dimension, that is slightly less than the interior diameter of each of upper and lower guide portions 182, 185 of the lumens in the insulated socket body 112. Each spring terminal 170a can, in one embodiment have an upper terminal, or upper contact end 170p, a cantilever spring portion 172 extending downward from the upper contact end, and a lower terminal, or lower contact end 170d, that extends downward from the cantilever spring portion 172. In the illustrated embodiment, the central cantilever portion 172 can be defined as a central cantilever double V-spring. The two V-springs 174, 176 can, in some embodiments, be mirrored about an X axis and the compression axis A, as shown in FIGS. 15 and 16, and share a central lever portion 175 that is disposed approximately in the center of the spring terminal 170a. The central cantilever portion 172 can have a generally rectangular cross-section. At least the central lever portion 175 can extend perpendicular to the terminal compression axis A which extends longitudinally through the upper and lower contact ends 170p, 170d, as shown in at least FIGS. 15 and 16. One end of the central cantilever portion 175 can turn downwardly in a V-shape 176 and merge into the lower contact end (round cross-section) 170d, while the opposing end 174 can turn upwardly in a V-shape and merge into the upper contact end 170p (round cross-section), thereby forming two opposing V-springs 174, 176 that are mirrored as described above. A maximum cross-sectional dimension L of the central cantilever portion, in a direction that is perpendicular to the compression axis A, can be less than the maximum interior diameter of the spring recess 183, 184 to allow the spring terminal 170a to be compressed.

Figure 17:
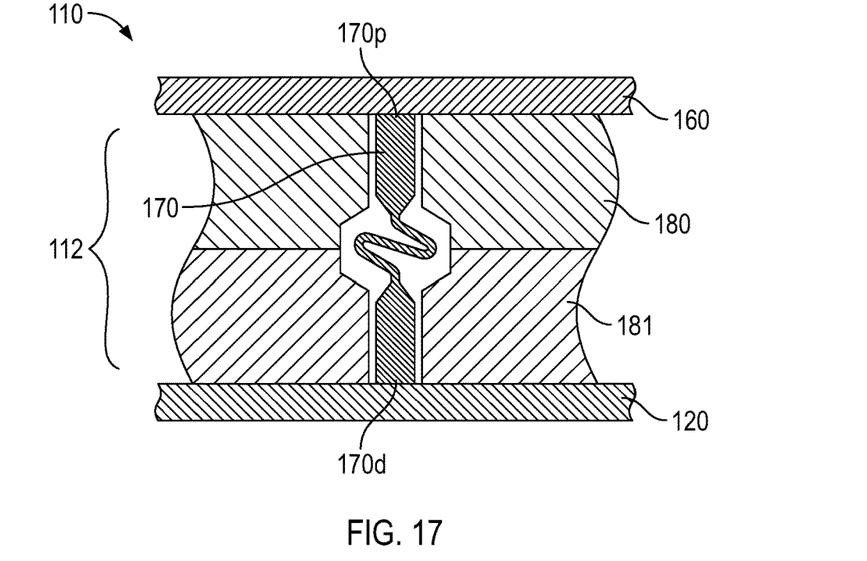
FIG. 17 is a cross-sectional view of an exemplary socket body and spring terminal assembled in contact with a PCB and LGA chip package.

When received into the mated socket body portions 180, 181, the contact ends 170p, 170d are guided by the contact guide openings 182, 185, respectively, while the spring portion 172 is received into the spring recesses 183, 184 which provides space for compression of the spring 170a. FIG. 9 illustrates a first, at rest condition, of the terminals 170a-c within the guide body 112. In this condition, both contact ends 170p, 170d project from the contact body 180, 181, and it can be appreciated that the upper and lower contact ends 170p, 170d are both independently compressible into the socket body 112. Turning to FIG. 17, the socket body and terminal assembly 110 is mounted in compression between a PCB 120 and an LGA chip package 160. Compression of the central cantilever V-spring structure 172 along compression axis A to a second, compressed condition, can be seen and movement of the horizontal 175 and extension portions 174, 176 of the spring can be seen within the spring recesses 183, 184, relative to the first condition of FIG. 9. The LGA frame and other structures are not shown for purposes of illustration and clarity of the inventive structures. Although not illustrated, it can be appreciated that when the socket assembly 110 is first mounted to the PCB, the lower contact ends 170d of the terminals 170 will engage and the spring portion 172 will be partially compressed, leaving the upper contact end 170p thereof still exposed and projecting from the socket body 112. Once the LGA chip package is seated and the frame closed, the upper contact end 170p will also be compressed into the configuration shown in FIG. 17.

The assembly thus features a novel spring terminal structures with opposing upper and lower contact ends which provides biased spring compression in both directions of contact and that provides independent movement of the upper and lower contact ends within a socket body.

Figure 18A:
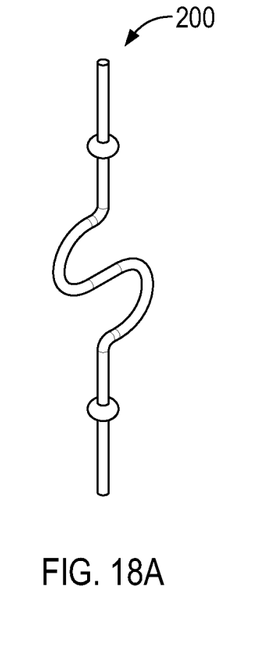
FIGS. 18a-c are various views of a spring terminal according to a second embodiment.
Figures 18B, 18C:
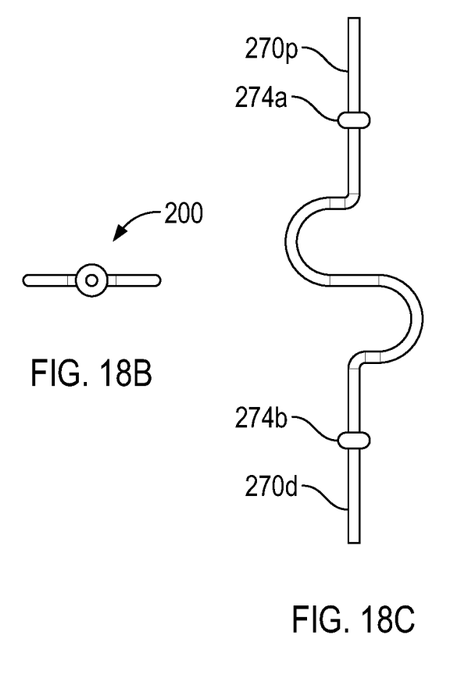

The instant disclosure contemplates alternative spring terminal constructions 200, 300, 400, 500. For the sake of simplicity, only the spring terminals will be discussed herein. Notably, in place of a spring terminal that provides for plural cross-sectional shapes, as shown in FIGS. 7-17, the alternative spring terminals discussed all illustrate a single cross-sectional shape. Alternatively, these additional spring terminals can be manufactured such that they include a plurality of cross-sectional shapes. FIGS. 18a-c illustrate an S-shape spring 272 form with a stop lug 274a, 274b formed on the upper and lower contact ends 270p, 270d. The S-shape spring 272 can be in the same location as the cantilever spring portion of the embodiment of FIGS. 7-17 and can be formed by two mirrored C-shaped sections, like the two V-shaped springs 174, 176 of FIG. 7-17. The two stop lugs 274a, 274b can be used to limit the travel of the upper and lower contact ends along the compression axis. As shown in FIG. 22, with respect to a terminal spring 670, which is structurally like the terminal spring 170, two lugs 674a, 674b can be disposed on the upper and lower contact end 670p, 670d of the terminal spring 670. The lumen 690 of the insulated socket body can extend through the upper and lower portions 680, 681 and can be similar to the lumen 190, with the addition of an upper most section 682, which extends downward to an upper stop lug section or shoulder 683, which in turn extends downward to a spring retention section 684. The spring retention section 684 can align with a lower spring retention section 685, which extends downward to a lower step lug section or shoulder 686, which in turn extends to a lower most section 687. The spring retention section 684 and the lower spring retention section 685 can have a first diameter; the upper and lower stop lug sections 683, 686 can have a second diameter; and the upper most and lower most sections 682, 687 can have a third diameter. Where, the third diameter is smaller than the second diameter, and the second diameter is smaller than the first diameter. As the two stop lugs 674a, 674a abut the upper most and lower most sections 682, 687, respectively, they are prevented from overextending there through. Moreover, the stops can prevent the central spring portions from contacting the lumen when the test fixture is fixed to a printed circuit board and a portion of the contacts are compressed.

Figure 19A:
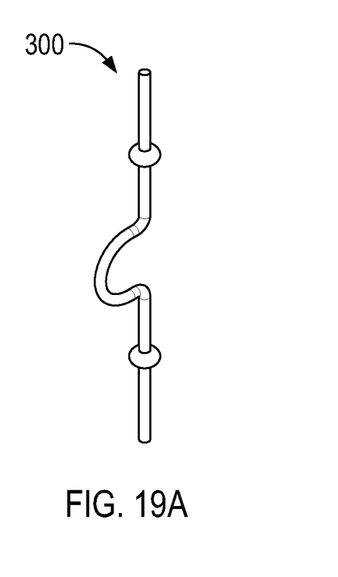
FIGS. 19a-c are various views of a spring terminal according to a third embodiment.
Figure 19B:
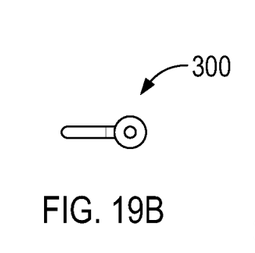
Figure 19C:
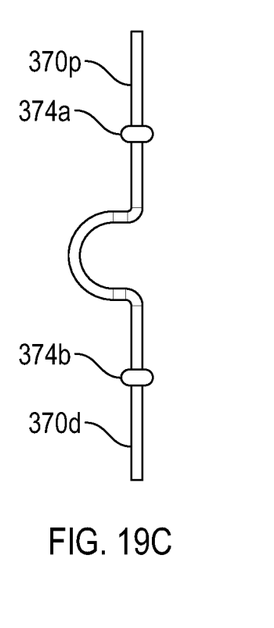
Figure 20A:
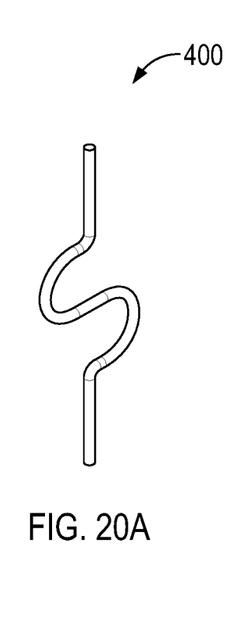
FIGS. 20a-c are various views of a spring terminal according to a fourth embodiment.
Figure 20B:
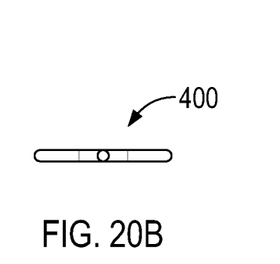
Figure 20C:
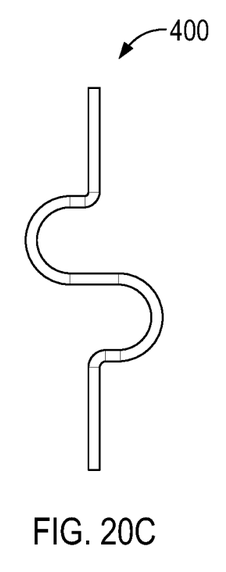
Figure 21A:
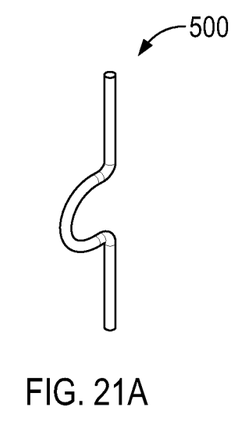
FIGS. 21a-c are various views of a spring terminal according to a fifth embodiment.
Figure 21B:
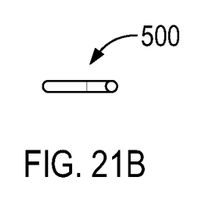
Figure 21C:
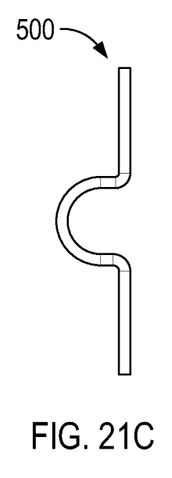

Alternatively, in place of the S shaped spring 200, as shown in FIGS. 19a-c, a C shape spring 300 can be formed with a stop lugs 374a, 374b formed on the upper and lower contact ends 370p, 370d. In a further alternative, FIGS. 20a-c illustrate an S shape spring form 400, like FIGS. 19a-c, without the stop lug formed on the contact ends. Further still, FIGS. 21a-c illustrate a C shape spring form 500 without the stop lug formed on the contact ends.

Referring now to the assembly shown in FIGS. 7-17, the present disclosure provides an improved insulated socket body and spring terminal assembly 110 comprised of an insulated socket body generally indicated 112 and a plurality of individual spring terminals 170. For the sake of simplicity, FIGS. 7-17 illustrate only the improved insulated socket body 112 and spring terminals 170 without the outer fixture and frame elements. However, it should be fully appreciated by one skilled in the art that the described socket body 112 and spring terminals 170 are configured to be received within the same or similar fixture 10 as described hereinabove. While only three terminals are shown, one of ordinary skill in the art would understand that these lumens and spring terminals would extend in an array as needed for the particular electrical device fixture. In general, the socket and terminal assembly 110 can be substantially similar to the socket assembly 10 shown in the prior art FIG. 6, for example. However, and importantly, the instant assembly 110 provides for an improved, reusable, and reliable electrical connection between the LGA chip 160 and the PCB 120. In some embodiments, the socket body 112 can be formed from an electrically insulating material, such as PVC, glass, asbestos, rigid laminate, varnish, resin, Teflon, rubber, etc. In the illustrated embodiment, as seen in FIGS. 8-10 and 17, the socket body 112 can be formed from two mating parts, namely an upper socket body portion 180 and a lower socket body portion 181, which are the same or similar. The socket body 112 can receive one or a plurality of spring terminals or contact members 170*a-c*, disposed in an array, within corresponding lumens 190 that extend through the upper and lower socket body portions 180, 181 of the socket body 112. In some embodiments, the lumens 190 can generally have at least two different diameters, or cross-sectional dimensions. In some alternatives, the lumen can have at least three different diameters, as shown in FIG. 22.

For example, as shown in FIGS. 9-11, the lumens 190 can have a first upper guide opening section 182 in the upper body portion having a first diameter, a second spring recess section 183 having at least a second larger diameter. The transition region 182*t* from the first upper guide section 182 to the second spring recess section 183 can be gradual, as shown, or can be defined by a perpendicular shoulder portion such that there is no gradual increase of the interior diameter, or in a further alternative, a rounded shoulder can provide for a gradual increase/decrease of diameter. A coaxially aligned portion of the lumen 190 can be disposed in the lower body portion 181 and can substantially mirror the first and second sections 182, 183 of the upper body portion 180. As illustrated, a third upper spring recess section 184 can define a second half of the spring recess and have a diameter that is the same as the second diameter. Again, similar to the second section, the third section can have a transition section 185*t* that defines a gradual reduction in diameter to the fourth lower portion 185. Extending downward from the third upper section 184, the fourth lower section 185 can define a second, lower, guide opening. The fourth lower section 185 can have an interior diameter that is substantially equal to the first diameter of the first upper section 182 in the upper body portion 180. The lumen 190 can be symmetrical about the contact plane between the upper and lower body portion 180, 181 or can be asymmetrical as shown in FIGS. 23 and 24. The upper and lower socket body portions 180, 181 can include a plurality of contact guide openings and spring recesses that, when mated together, form a plurality of axial guide passages and spring recesses for the respective terminals 170 received therein. The upper and lower socket body portions 180, 181 can be fixed together by known methods. The respective springs 170*a-c* disposed within the plurality of lumens 190 can be specially designed, as discussed below, to ensure proper contact between the LGA chip 160 and the PCB 120. Moreover, the respective springs 170*a-c* can be designed to be constrained within the socket body 110, no matter the orientation of the socket body itself, thereby reducing the possibility of the springs 170*a-c* being lost during transport, installation, or other handlings.

Referring to FIG. 23, yet another exemplary spring terminal 770 is shown. In contrast to the prior embodiments, the embodiment of FIG. 23 differs in that the contact guide openings 782, 785 of the mated socket body portions 780, 781 can be mirrored in both the contact plane between the body portions 780, 781 and about the central axis A of the openings 782, 785. Additionally, or alternatively, the contact guide openings 782, 785 themselves can be partially eccentric with respect to the central axis A such that a first side wall can be disposed at a first distance from the axis A and a second side wall can be disposed at a second distance from the axis A, such that the first and second distances are different. As the contact guide openings 782, 785 are merely mirrored with respect to the contact plane and the central axis, only the geometry of the guide opening 782 will be discussed for the sake of brevity.

The first, upper, opening 782 can have a first upper guide opening section 782*a* in the upper body portion having a first diameter that is concentric with the central axis A. The opening 782 can extend downward towards a second spring recess section 782*b* defined by cross-sectional walls 783, 784, having at least a second larger diameter that is eccentric with both the central axis A and the first upper guide opening 782*a*. A first transition region 783*t* can extend from the first upper guide section 782*a* to a first lower wall section 783 which defines part of the second spring recess section 782*b*. The first transition region 783*t* can extend at a gradual first angle $\alpha$, as shown, or can be defined by a perpendicular shoulder portion such that there is no gradual increase of the interior diameter, or in a further alternative, a rounded shoulder can provide for a gradual increase/decrease of diameter. The first lower wall section 783 can be disposed a first distance from the central axis. On the opposite side of the central axis A, a second transition region 784*t* can extend from the first upper guide section 782*a* to a second lower wall section 784 which can define part of the second spring recess section 782*b*. The second transition region 784*t* can extend at a gradual second angle $\beta$, as shown, or can be defined by a perpendicular shoulder portion such that there is no gradual increase of the interior diameter, or in a further alternative, a rounded shoulder can provide for a gradual increase/decrease of diameter. The second lower wall section 784 can be disposed a second distance from the central axis A. The first angle $\alpha$ and the second angle $\beta$, as shown in FIG. 23, are different such that the first and second lower wall sections, 783, 784 are of different lengths and disposed at different distances from the central axis A. The first and second lower wall sections 783, 784 can extend downward, towards the lower socket body portion 781 to the mating plane 795.

One advantage of the present embodiment of FIG. 23 is the eccentric design provides a stop 785 to be created in the first upper guide portion 782. The stop 785 can be created at the intersection between the horizontal upper face 791 of the lower socket body portion 781 and the first lower wall section 783. Similarly, in the lower socket body portion 787*b* a second stop 786 can be formed via the lower face 790 of the upper socket body portion 780 and a portion of the lower guide portion, unenumerated. The stops 785, 786 can be used to provide a fixed counter force point for a horizontal section 777 of the spring terminal 770 to provide for predictable loading of the spring terminal 770.

The upper and lower socket body portions 780, 781 can include a plurality of contact guide openings and spring recesses that, when mated together, form a plurality of axial guide passages and spring recesses for the respective terminals 770 received therein. The upper and lower socket body portions 780, 781 can be fixed together by known methods. In the fixed configuration, as shown in FIG. 23, the first upper guide opening 782a, the second lower guide opening 787a, and the central axis A are all concentric. In contrast, both of the first lower guide opening 782b and the second upper guide opening 787b are eccentric with each other, the first upper guide opening 782a, the second lower guide opening 787a, and the central axis A.

The terminal springs 770 disposed within the contact guide openings 782, 785 can be specially designed, as discussed below, to ensure proper contact between an LGA chip and a PCB (not shown). Moreover, the spring 770 can be designed to be constrained within the contact guide openings 782, 785, no matter the orientation of the socket body itself, thereby reducing the possibility of the springs 770 being lost during transport, installation, or other handlings.

The spring terminals 770 can be formed from any conductive metal which maintains an elastic spring bias in compression and can be formed from any cross-sectional shape such as round, rectangular, or square or a combination of stamped or formed shapes as illustrated. As shown in FIG. 23, the upper and lower contact ends 770p, 770d can have a diameter D, or cross-sectional dimension, that is slightly less than the interior diameter of each of upper and lower guide portions 782a, 787a. The spring terminal 770 can, in one embodiment have an upper terminal, or upper contact end 770p, a first "Z" shaped cantilever spring portion 772 extending downward from the upper contact end 770p, and a lower terminal, or lower contact end 770d, that extends downward from the second "Z" shaped cantilever spring portion 774. In the illustrated embodiment, the first "Z" shaped cantilever spring portion 772 and the second "Z" shaped cantilever spring portion 774 can share a central lever portion 773 that is disposed approximately in the center of the spring terminal 770. At least the central lever portion 773 can extend perpendicular to the terminal compression axis, which extends longitudinally through the upper and lower contact ends 770p, 770d and can be the same and the central axis A. The first and second "Z" shaped cantilever spring portions 772, 774 and the central lever portion 773 can have a generally rectangular cross-section and the proximal and distal contact ends 770p, 770d can have a generally circular cross-section. The first and second "Z" shaped cantilever spring portions 772, 774 can, in some embodiments, be mirrored about an X axis and the central axis A. The first "Z" shaped cantilever spring portion 772 can be configured to be retained, in any configuration, within the first lower contact guide portion 782b and the proximal contact end 770p can be retained in the first upper contact guide portion 782a. Further, second "Z" shaped cantilever spring portion 774 can be configured to be retained, in any configuration, within the second upper contact guide portion 787b and the distal contact end 770d can be retained in the second lower contact guide portion 787a.

In an alternative embodiment, the spring terminal 870 can be substantially the same as the spring terminal 770 in the embodiment of FIG. 23, as shown in FIG. 24.

While the invention is illustrated herein in connection with a conventional LGA socket assembly and LGA chip package for semiconductors, it should be understood that LGA packages are manufactured and used in many other sizes and devices in many other industries. The presently disclosed contact body and terminal can be effectively utilized in any size LGA package and with varying LGA socket connectors and test sockets.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claim.

What is claimed is:

1. An insulated socket body and terminal assembly comprising,
   an upper insulated socket body portion;
   a lower insulated socket body portion,
   wherein the upper and lower insulated socket body portions are received together in mated relation to define a socket body having at least one lumen extending therethrough; and
   at least one spring terminal received within the at least one lumen, the spring terminal including upper and lower contact ends connected by a central cantilever spring,
   wherein the central cantilever spring is received within a central recess portion of the lumen and the upper and lower contact ends are received in respective upper and lower guide portions of the lumen and project outwardly from respective upper and lower surfaces of the upper and lower insulated socket body portions, said central recess portion of the at least one lumen being configured to retain the cantilever spring of at least one spring terminal in a first uncompressed configuration and in a second compressed configuration,
   wherein the upper and lower insulated socket body portions are at least partially eccentric with respect to each other, and
   wherein the upper and lower insulated socket body portions are eccentric with respect to each other at a mating plane between the upper and lower insulated socket portions such that there is an upper shoulder defined at a lower end of the upper insulated socket body portion and a lower shoulder defined at an upper end of the lower insulated socket body.

2. The assembly of claim 1, wherein the upper and lower insulated socket body portions are at least partially eccentric with respect to a central axis of the at least one lumen.

3. The assembly of claim 1, wherein the central cantilever spring of the at least one spring terminal is formed in the shape of a Z shape, double Z shape, V shape, C shape, S shape, or double V shape.

4. The assembly of claim 1,
   wherein the upper and lower contact ends of the at least one spring terminal have a circular cross section, and
   wherein the central cantilever spring has a rectangular cross section.

5. The assembly of claim 1, wherein the at least one spring terminal has a circular cross section.

6. The assembly of claim 1, wherein the central cantilever spring includes at least one horizontally extending portion that is disposed against the upper and lower shoulders.

7. The assembly of claim 1,
   wherein the central cantilever spring includes a first Z-shaped spring and a second Z-shaped spring, and
   wherein the first Z-shaped spring and the second Z-shaped spring are mirrored about a compression axis of the at least one spring terminal and an axis which is perpendicular to the compression axis.

8. The assembly of claim 1, wherein the at least one spring terminal is monolithic.

9. The assembly of claim 1, further comprising a plurality of lumens and a plurality of spring terminals.

10. An electronic device fixture, the fixture comprising:
a lower frame;
an upper load plate hinged to the lower frame,
an insulated socket body received in the lower frame, the insulated socket body comprising,
an upper insulated socket body portion, and
a lower insulated socket body portion, wherein the upper and lower insulated socket body portions are received together in mated relation and define a plurality of lumens extending therethrough;
a plurality of spring terminals each respectively received within the plurality of lumens, the plurality of spring terminals each including upper and lower contact ends connected by a central cantilever spring,
wherein the central cantilever spring of each spring terminal is received within a central recess portion of each respective lumen and the upper and lower contact ends of each spring terminal are received in respective upper and lower guide portions of each respective lumen and project outwardly from respective upper and lower surfaces of the upper and lower insulated socket body portions, said central recess portion of each respective lumen being configured to retain the respective cantilever spring of each respective spring terminal in a first uncompressed configuration and in a second compressed configuration, and
wherein the upper and lower insulated socket body portions are eccentric with respect to each other at a mating plane between the upper and lower insulated socket portions such that there is an upper shoulder defined at a lower end of the upper insulated socket body portion and a lower shoulder defined at an upper end of the lower insulated socket body.

11. The fixture of claim 10, wherein the upper and lower insulated socket body portions are at least partially eccentric with respect to a central axis of the at least one lumen.

12. The fixture of claim 10, wherein the central cantilever spring of each respective spring terminal is formed in the shape of a Z shape, a double Z shape, V shape, C shape, S shape, or double V shape.

13. The fixture of claim 10,
wherein the upper and lower contact ends of each respective spring terminal have a circular cross section, and
wherein the central cantilever spring of each respective spring terminal has a rectangular cross section.

14. The fixture of claim 10, wherein each respective spring terminal has a circular cross section.

15. The assembly of claim 10, wherein the central cantilever spring includes at least one horizontally extending portion that is disposed against the upper and lower shoulders.

16. The assembly of claim 10,
wherein the central cantilever spring includes a first Z-shaped spring and a second Z-shaped spring, and
wherein the first Z-shaped spring and the second Z-shaped spring are mirrored about a compression axis of the at least one spring terminal and an axis which is perpendicular to the compression axis.

17. The fixture of claim 10, wherein each respective spring terminal is monolithic.

18. An insulated socket body and terminal assembly comprising,
an upper insulated socket body portion;
a lower insulated socket body portion,
wherein the upper and lower insulated socket body portions are received together in mated relation to define a socket body having at least one lumen extending therethrough, and
wherein the upper and lower insulated socket body portions are eccentric with respect to each other at a mating plane such that there is an upper stop shoulder defined at a lower end of the upper insulated socket body portion and a lower stop shoulder defined at an upper end of the lower insulated socket body; and
at least one spring terminal received within the at least one lumen, the spring terminal including upper and lower contact ends connected by a central cantilever spring,
wherein the central cantilever spring is received within a central recess portion of the lumen and the upper and lower contact ends are received in respective upper and lower guide portions of the lumen and project outwardly from respective upper and lower surfaces of the upper and lower insulated socket body portions, said central cantilever spring having opposing ends which respectively engage said upper and lower stop shoulders to provide respective fixed spring points for the upper and lower contact ends of said spring terminal.

19. The insulated socket body and terminal assembly of claim 18 wherein a portion of the central cantilever spring extends transversely across said lumen.

20. The insulated socket body and terminal assembly of claim 18 wherein a portion of the central cantilever spring extends parallel to said mating plane.

* * * * *